United States Patent
Fu et al.

(10) Patent No.: US 7,067,433 B2
(45) Date of Patent: Jun. 27, 2006

(54) METHOD TO REDUCE THE FLUORINE CONTAMINATION ON THE AL/AL-CU PAD BY A POST HIGH CATHOD TEMPERATURE PLASMA TREATMENT

(75) Inventors: Wen-Jui Fu, Hsin-Chu (TW); Shang-Ru Shen, Hsin-Chu (TW); Yun-Hung Shen, Hsin-Chu (TW); Chao-Cheng Chen, Hsing-Chin (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 160 days.

(21) Appl. No.: 10/706,382

(22) Filed: Nov. 12, 2003

(65) Prior Publication Data
US 2005/0101110 A1   May 12, 2005

(51) Int. Cl.
*H01L 21/00* (2006.01)

(52) U.S. Cl. ............... 438/712; 438/471; 438/473

(58) Field of Classification Search ........... 438/712, 438/471, 473
See application file for complete search history.

(56) References Cited

U.S. PATENT DOCUMENTS

| | | | |
|---|---|---|---|
| 5,380,401 A * | 1/1995 | Jones et al. ............ | 438/712 |
| 5,731,243 A | 3/1998 | Peng et al. ............ | 438/612 |
| 5,755,891 A | 5/1998 | Lo et al. ............... | 134/1.2 |
| 5,770,098 A * | 6/1998 | Araki et al. ........... | 216/67 |
| 5,776,832 A | 7/1998 | Hsieh et al. ........... | 438/669 |
| 5,824,234 A | 10/1998 | Jou et al. .............. | 216/18 |
| 5,854,134 A | 12/1998 | Lan et al. .............. | 438/695 |
| 5,942,446 A | 8/1999 | Chen et al. ............ | 438/734 |
| 5,970,376 A | 10/1999 | Chen .................... | 438/637 |
| 6,063,207 A | 5/2000 | Yu et al. ............... | 134/2 |
| 6,136,680 A | 10/2000 | Lai et al. .............. | 438/597 |
| 6,162,733 A | 12/2000 | Obeng .................. | 438/706 |

* cited by examiner

*Primary Examiner*—Laura M. Schillinger
(74) *Attorney, Agent, or Firm*—Thomas, Kayden, Horstemeyer & Risley

(57) ABSTRACT

A method of reducing fluorine contamination on a integrated circuit wafer surface is achieved. The method comprises placing an integrated circuit wafer on a cathode stage. The integrated circuit wafer comprises a surface contaminated with fluorine. The integrated circuit wafer is plasma treated with a plasma comprising a reducing gas that forms HF from the fluorine and a bombardment gas that removes the fluorine from the surface. The cathode stage is heated to thereby increase the rate of the fluorine removal.

20 Claims, 3 Drawing Sheets

METHOD TO REDUCE THE FLUORINE CONTAMINATION ON THE AL/AL-CU PAD BY A POST HIGH CATHOD TEMPERATURE PLASMA TREATMENT

BACKGROUND OF THE INVENTION (1) Field of the Invention

The invention relates to a method to reduce fluorine contamination on the surface of an integrated circuit device and, more particularly, to a method to remove fluorine using a high cathode temperature plasma treatment.

(2) Description of the Prior Art

The fabrication of integrated circuit devices typically involves a large number of steps to deposit and pattern various layers. In a typical sequence, a layer, or film, is deposited upon the wafer surface. A masking layer is then deposited over the film. The masking layer is patterned to reveal selected portions of the film while concealing other selected portions. The masking layer may then be used to mask an etching process that is used to selectively remove the exposed portion of the film. This type of sequence is common to semiconductor manufacturing but may result in undesirable consequences.

Referring now to FIG. 1, an exemplary prior art integrated circuit device structure is shown in cross section. A substrate 10 comprises, for example, a semiconductor such as silicon. An insulator layer 14 is formed overlying the substrate 10. A patterned metal layer 18 is formed overlying the insulator 14. A passivation layer 22 is formed overlying both the insulator layer 14 and the patterned metal 18. In this particular example, the metal section 18 is patterned to form a bonding pad for the circuit. It is necessary, therefore, to form openings, or pad openings, in the passivation layer 22 to thereby expose the metal pad 18.

To form the openings, a masking layer 24 is deposited overlying the passivation layer 22. For example, a photoresist layer 24 is coated overlying the passivation layer 22. This deposited photoresist layer 24 is first exposed to actinic light through a mask and is then developed to remove portions overlying the metal bonding pad 18 as shown. The patterned masking layer 24 is then used as a mask for etching the pad openings in the passivation layer 22.

Typically, the etching process for the pad etch comprises a fluorine-containing chemistry. For example, $CF_4$ or $SF_6$ may be used in the dry pad etch process. In these processes, the fluorine ions 28 exhibit excellent etching properties in terms of selectivity and anisotropic etching as shown in FIG. 2.

A problem with the fluorine-based chemistry is also demonstrated in FIG. 2. A high concentration of ionic fluorine species 28 is left behind after the etch. The presence of this fluorine contamination causes several problems. First, since the metal layer 18 is typically aluminum or an alloy of aluminum and copper, the fluorine tends to cause corrosion. Second, the fluorine causes pad crystal defects. These problems ultimately lead to poor bonding capability. This is especially true if a long queue (Q) time occurs between the pad etching process and any subsequent pad alloy processing. The presence of the fluorine, coupled with a long waiting time (sometimes many weeks) and environmental conditions (such as humidity) can cause excessive corrosion and crystal defects as shown by Auger data.

Several prior art inventions describe pad etching and contamination removal methods. U.S. Pat. No. 6,162,733 to Obeng teaches a method to remove alkali metal and halogen-based contaminants from an integrated circuit device. Halogen-based contaminants are removed using a plasma process. U.S. Pat. No. 6,063,207 to Yu et al discloses etching a bonding pad opening using a fluorine based plasma. Fluorine contamination is then removed using a rinse with a DI water solution containing $CO_2$. U.S. Pat. No. 5,824,234 to Jou et al describes a bonding pad method. After etching the bonding pad opening with a fluorine-containing plasma, the fluorine contamination is removed by dipping the wafer in a TMAH solution. U.S. Pat. No. 5,380,401 to Jones et al teaches a method to remove fluorine contamination from bonding pads. A plasma process using $CO_2$ and Ar is described. U.S. Pat. No. 5,970,376 to Chen discloses a method to remove a fluorocarbon polymer from a wafer surface using an inert gas plasma. The focus is treating a spin-on material. U.S. Pat. 5,770,098 to Araki et al describes a plasma etching process. U.S. Pat. No. 5,942,446 to Chen et al discloses a method of patterning a silicon-containing layer using plasma etching. U.S. Pat. No. 5,776,832 to Hsieh et al teaches a method to prevent corrosion of metal lines by performing an $O_2$ ashing step after etching metal lines with $BCl_3$ or with $Cl_2$. U.S. Pat. No. 5,755,891 to Lo et al discloses a method to treat after metal etch. The method uses a plasma comprising a mixture of $O_2$ and $CF_4$ gases. U.S. Pat. No. 6,136,680 to Lai et al describes methods to process fluorinated silicate glass (FSG) film by performing plasma treatments using N2, NH3, O2, or N2O or by performing Ar sputtering. U.S. Pat. No. 5,854,134 to Lan et al teaches performing a plasma treatment on a metal layer using a fluorine containing plasma to thereby form a thin polymeric passivation layer on the metal. U.S. Pat. No. 5,731,243 to Peng et al discloses a method to remove residue from a bonding pad using a dip in a solution comprising DMDO and MEA followed by an oxygen plasma treatment.

SUMMARY OF THE INVENTION

A principal object of the present invention is to provide an effective and very manufacturable method for removing fluorine contamination from the surface of an integrated circuit.

A further object of the present invention is to provide a method to remove fluorine surface contamination from aluminum-based bonding pads.

Another further object of the present invention is to remove fluorine contamination using a plasma treatment where the cathode stage is heated.

Another further object of the present invention is to plasma treat using an inert, bombardment gas.

Another further object of the present invention is to plasma treat using a reducing gas to form HF from the fluorine and then a bombardment gas to remove the fluorine in HF form.

Another yet further object of the present invention is to increase the process immunity to pad crystal defects caused by the presence of fluorine.

Another yet further object of the present invention is to increase the queue (Q) time window from pad etch to alloy stage.

Another yet further object of the present invention is to improve the bonding performance of pads.

In accordance with the objects of this invention, a method of reducing fluorine contamination on an integrated circuit wafer surface is achieved. The method comprises placing an integrated circuit wafer on a cathode stage. The integrated circuit wafer comprises a surface contaminated with fluorine. The integrated circuit wafer is then plasma treated. The plasma comprises a bombardment gas that removes the fluorine from the surface. The cathode stage is heated to thereby increase the rate of the fluorine removal.

Also in accordance with the objects of this invention, a method of reducing fluorine contamination on a integrated circuit wafer surface is achieved. The method comprises placing an integrated circuit wafer on a cathode stage. The integrated circuit wafer comprises a surface contaminated with fluorine. The integrated circuit wafer is plasma treated with a plasma comprising a reducing gas that forms HF from the fluorine and a bombardment gas that removes the fluorine from the surface. The cathode stage is heated to thereby increase the rate of the fluorine removal.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to reduce fluorine contamination on the surface of an integrated circuit device. The method uses plasma treatment with a high cathode stage temperature. It should be clear to those experienced in the art that the present invention can be applied and extended without deviating from the scope of the present invention.

Figure 1:
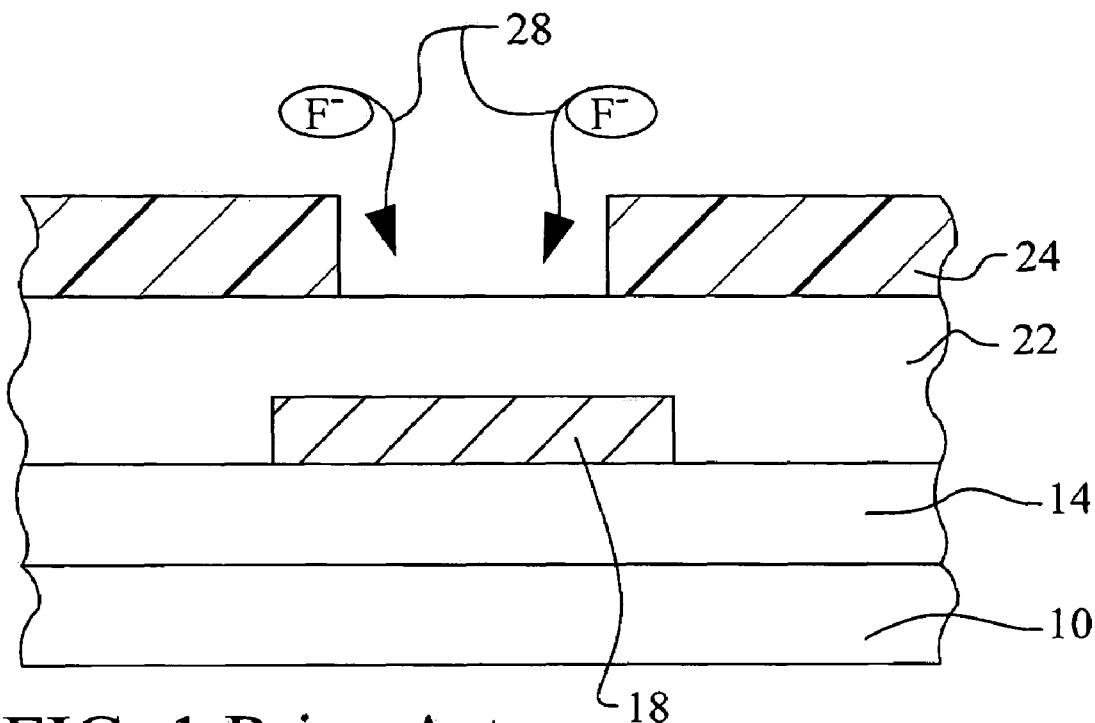
FIGS. 1 and 2 illustrate a prior art example of the formation of fluorine contamination on the surface of integrated circuit bonding pads.
Figure 2:
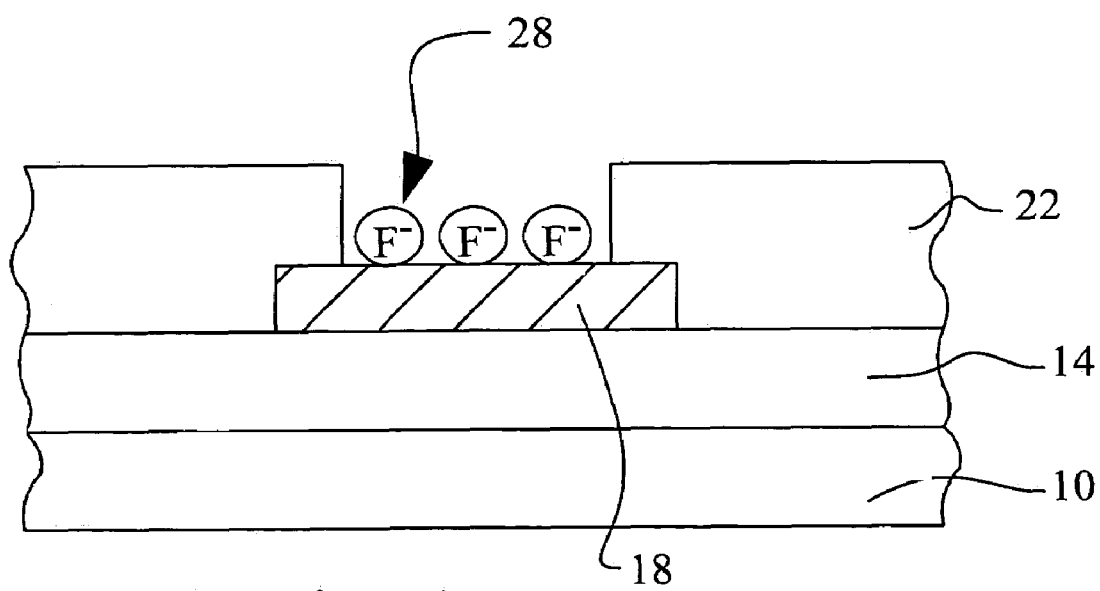

Referring again to FIGS. 1 and 2, the preferred embodiments of the present invention provide a novel solution to the removal of fluorine contamination 28 from the surface of the integrated circuit wafer. The present invention is particularly well suited for fluorine removal following the pad passivation etch where a fluorine-containing gas is used. However, the present invention may be applied to other fluorine contamination situations.

Figure 3:
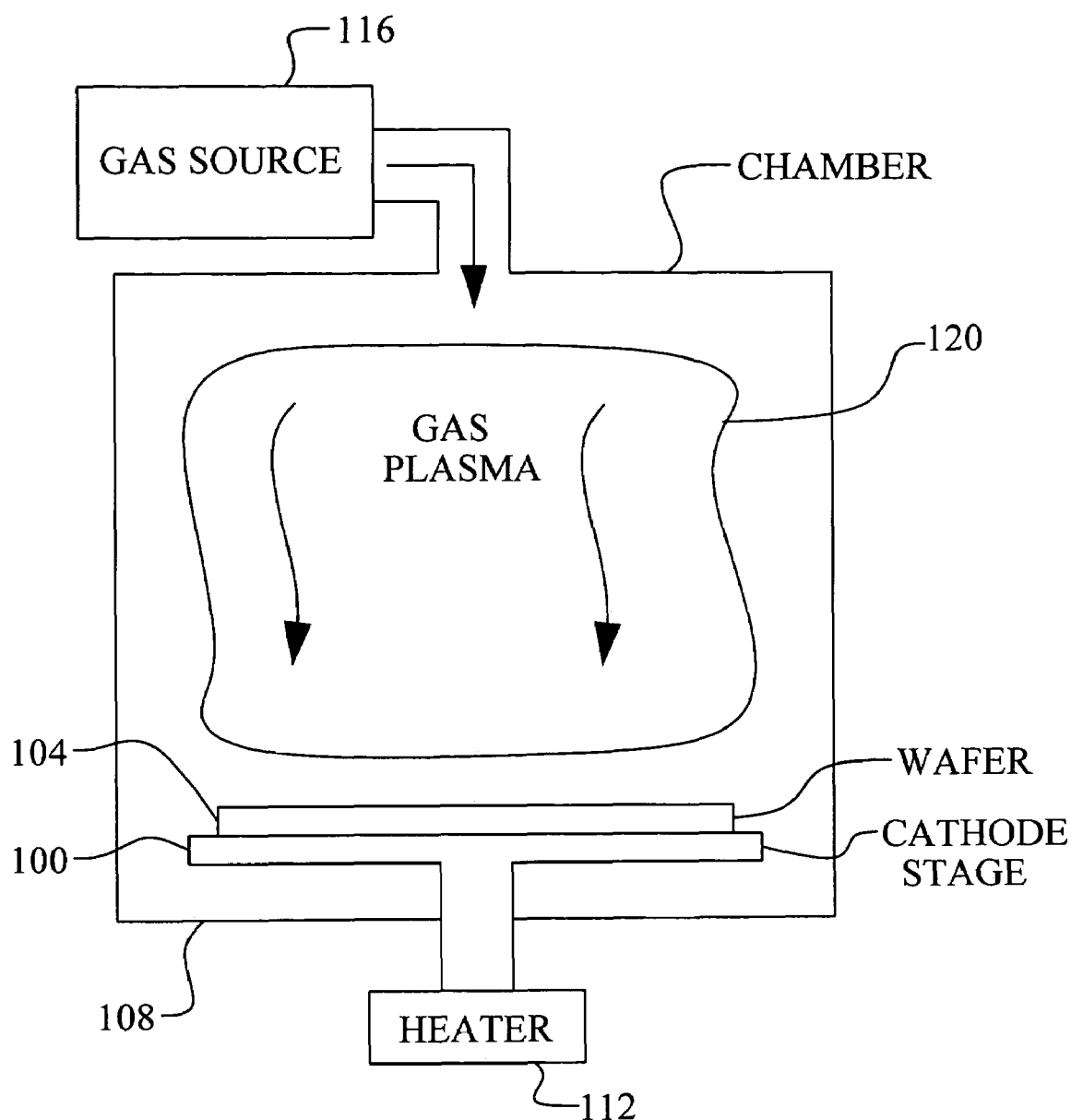
FIG. 3 illustrates an exemplary plasma chamber for performing the method of the present invention.

Referring now to FIG. 3, a simplified schematic of a plasma reaction chamber 108 for performing the method of the present invention is shown. As an important feature, the chamber 108 comprises a cathode stage 100 having a heating means 112. The heating means 112 must be capable of heating the cathode stage 100 to a high temperature of preferably between about 50 degrees C. and about 500 degrees C. The integrated circuit wafer 104 is placed on the cathode stage 100.

By heating the cathode stage 100, the wafer 104 is likewise heated. This is an important feature of the present invention. Heating the wafer 104 increases the kinetic energy of the fluorine ions or, in certain cases, the HF molecules on the wafer surface. The increased kinetic energy state of the fluorine contamination increases the effectiveness of the plasma treatment process of the present invention.

As a further important feature, the chamber 100 includes a gas source 116 that controls the flow of the gas or the gas combinations that are used in the gas plasma 120. While the features which generate the gas plasma 120 are not shown, the methods for generating such plasma 120 are well known in the art.

Figure 4:
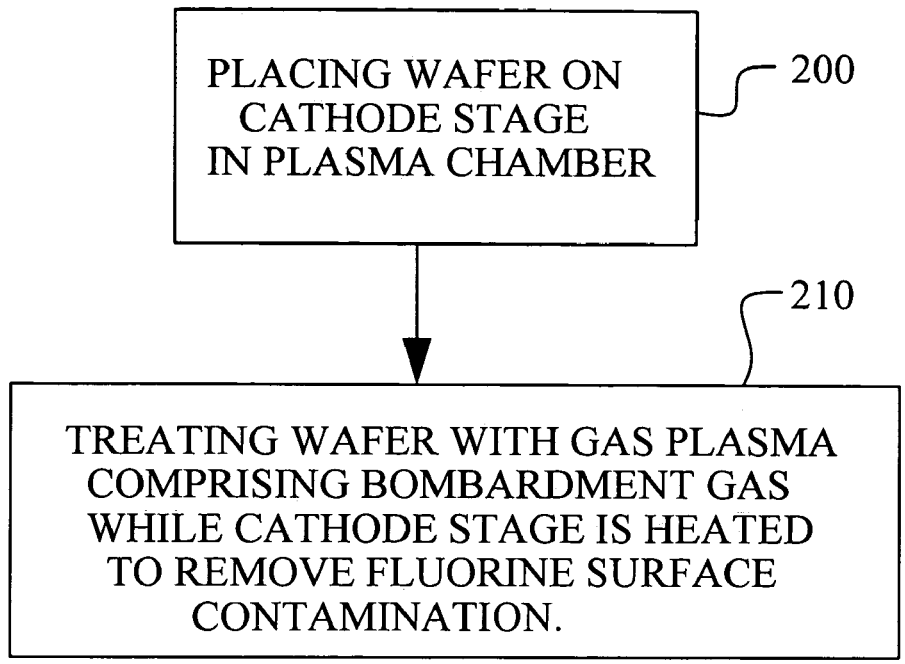
FIG. 4 illustrates a first preferred embodiment method of the present invention using only a bombardment gas in the plasma.

Referring now to FIG. 4, a first embodiment of the method of the present invention is shown. A wafer is placed on the cathode stage of the above-described plasma chamber in step 200. The integrated circuit wafer comprises a surface contaminated with fluorine such as in the case of the post pad etch device of prior art FIG. 2. Preferably, the contaminated surface comprises the metal bonding pads that have been exposed by the passivation pad etch shown in FIGS. 1 and 2. More preferably, the metal bonding pads comprise an aluminum-containing material such as aluminum (Al) or aluminum-copper (Al—Cu) alloy.

Referring again to FIG. 4, the integrated circuit wafer is then plasma treated in step 210. Two important features of the plasma treatment should be noted. First, the cathode stage is heated to thereby increase the rate of the fluorine removal as described above. Preferably, the cathode stage is heated to a high temperature of between about 50 degrees C. and about 500 degrees C. Second, the plasma comprises a bombardment gas that removes the fluorine from the surface. In particular, the bombardment gas preferably comprises a non-reacting gas such as nitrogen ($N_2$) or argon (Ar). Other non-reacting gases could be used. Preferably, the bombardment gas has a pressure between about 0.005 Torr and about 5 Torr. The plasma is preferably energized using a RF energy of between about 10 Watts and about 2,000 Watts.

The bombardment gas plasma works by physical dislocation of the fluorine contamination from the surface of the wafer. That is, the combination of the cathode stage heating to raise the kinetic energy of the fluorine ions or molecules, combined with the kinetic energy due to plasma impact, causes the fluorine to be abstracted from the surface of the pads.

Figure 5:
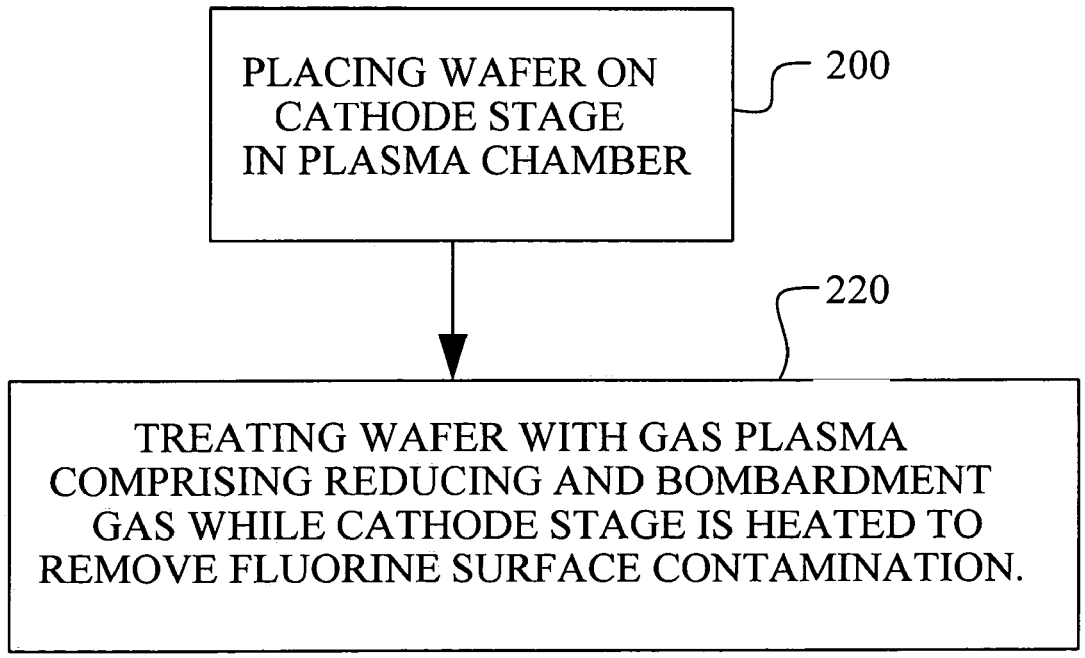
FIG. 5 illustrates a second preferred embodiment method of the present invention using both a reducing gas and a bombardment gas in the plasma.

Referring now to FIG. 5, a second preferred embodiment of the present invention is shown. Again, the wafer is placed in the cathode stage of the plasma chamber in step 200. In step 220, however, a reducing gas is added to the bombardment gas. The reducing gas reacts with ionic fluorine to produce a fluorine-containing molecule that can be more easily removed by the bombardment gas. Preferably, the reducing gas comprises hydrogen ($H_2$) that reacts with the fluorine ions to produce hydrofluoric acid (HF). The bombardment gas preferably comprises nitrogen ($N_2$). Preferably, the bombardment/reducing gas has a pressure between about 0.005 Torr and about 5 Torr. The plasma is preferably energized using a RF energy of between about 10 Watts and about 2,000 Watts.

The heating of the cathode stage again improves the fluorine removal capability by increasing the kinetic energy of the fluorine or the fluorine-containing molecules. This improves the performance of the bombardment plasma in removing the contamination. Preferably, the cathode stage is heated to a temperature of between about 50 degrees C. and about 500 degrees C.

Experimental data confirms the capability of the novel method in reducing pad crystal defects. In an experiment, a control wafer was etched using the passivation pad etch process, comprising the fluorine-containing plasma, was stripped of resist, and was then stored in a wet box. Experiment wafers were likewise subjected to a passivation pad etch and resist strip. However, in this case, the novel plasma treatment method was performed on the experimental wafers using the bombardment only ($N_2$ or Ar) or the bombardment/reducing ($N_2/H_2$) plasma processes. The experimental wafers were then stored in wet boxes. Auger testing was then performed on the wafers to check for pad crystal defects. The untreated wafers showed significant crystal defects while the treated wafers showed no crystal defects. The treatment technique improves the bonding capability of the bonding pads by eliminating crystal defects. In addition, the storage or queue (Q) time of the integrated circuit wafers is increased because the corrosive fluorine has been removed.

The advantages of the present invention may now be summarized. An effective and very manufacturable method for removing fluorine contamination from the surface of an integrated circuit is achieved. The method removes fluorine surface contamination from aluminum-based bonding pads. The fluorine contamination is removed using an inert, bombardment gas plasma treatment where the cathode stage is heated. Alternatively, a reducing gas is added to the bombardment gas to form HF from the fluorine and then to remove the fluorine in HF form. The invention increases the process immunity to pad crystal defects caused by the presence of fluorine. The queue (Q) time window from pad etch to alloy stage is increased. Finally, the bonding performance of pads is improved.

As shown in the preferred embodiments, the novel method of removing fluorine surface contamination using a plasma treatment with a high cathode stage temperature provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method of reducing fluorine contamination on a integrated circuit wafer surface comprising:
   placing an integrated circuit wafer on a cathode stage wherein said integrated circuit wafer comprises a surface contaminated with fluorine; and
   treating said integrated circuit wafer surface with a plasma to remove said fluorine from said surface wherein said cathode stage is heated to a temperature to thereby increase the rate of said fluorine removal.

2. The method according to claim 1 wherein said surface comprises bonding pads.

3. The method according to claim 1 wherein said surface comprises an aluminum containing layer.

4. The method according to claim 1 wherein said heating of said cathode stage comprises a temperature range of between about 50 degrees C. and about 500 degrees C.

5. The method according to claim 1 wherein said step of bombarding comprises $N_2$ gas.

6. The method according to claim 1 wherein said step of bombarding comprises argon gas.

7. The method according to claim 1 wherein said step of bombarding further comprises a reducing gas to form HF from said fluorine contamination wherein said HF is removed by said bombardment gas.

8. The method according to claim 7 wherein said reducing gas comprises $H_2$.

9. A method of reducing fluorine contamination on a integrated circuit wafer surface comprising: placing an integrated circuit wafer on a cathode stage wherein said integrated circuit wafer comprises a surface contaminated with fluorine; and treating said integrated circuit wafer with a plasma wherein said plasma comprises a bombardment gas tat removes said fluorine from said surface, wherein said cathode stage is heated to a high temperature to thereby increase the rate of said fluorine removal, and wherein said heating of said cathode stage comprises a temperature range of between 50 degrees C. and 500 degrees C.

10. The method according to claim 9 wherein said surface comprises bonding pads.

11. The method according to claim 9 wherein said surface comprises an aluminum containing layer.

12. The method according to claim 9 wherein said bombardment gas comprises $N_2$.

13. The method according to claim 9 wherein said bombardment gas comprises argon.

14. The method according to claim 9 wherein said step of treating further comprises a reducing gas to form HF from said fluorine contamination wherein said HF is removed by said bombardment gas.

15. The method according to claim 14 wherein said reducing gas comprises $H_2$.

16. A method of reducing fluorine contamination on a integrated circuit wafer surface comprising: placing an integrated circuit wafer on a cathode stage wherein said integrated circuit wafer comprises a surface contaminated with fluorine; and treating said integrated circuit wafer with a plasma wherein said plasma comprises a reducing gas that forms HF from said fluorine and a bombardment gas that removes said HF from said surface, wherein said cathode stage is heated to a high temperature to thereby increase the rate of said fluorine removal, and wherein said heating of said cathode stage comprises a temperature range of between 50 degrees C. and 500 degrees C.

17. The method according to claim 16 wherein said surface comprises an aluminum containing layer.

18. The method according to claim 16 wherein said bombardment gas comprises $N_2$.

19. The method according to claim 16 wherein said bombardment gas comprises argon.

20. The method according to claim 16 wherein said reducing gas comprises $H_2$.

* * * * *